United States Patent [19]
Chen et al.

[11] Patent Number: 6,090,153
[45] Date of Patent: *Jul. 18, 2000

[54] MULTI-THRESHOLD-VOLTAGE DIFFERENTIAL CASCODE VOLTAGE SWITCH (DCVS) CIRCUITS

[75] Inventors: Wei Chen, Croton; Wei Hwang, Armonk, both of N.Y.; Prabhakar Nandavar Kudva, Danbury, Conn.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/985,367

[22] Filed: Dec. 5, 1997

[51] Int. Cl.$^7$ .................................................. G06F 17/50
[52] U.S. Cl. .................................. 716/8; 716/1; 326/434; 326/113; 326/121; 326/93
[58] Field of Search .................................. 326/93, 95, 97, 326/98; 327/419, 427, 434, 387, 389, 391; 395/500.09, 500.03, 500.08

[56] References Cited

U.S. PATENT DOCUMENTS 5,774,367  6/1998  Reyes et al. ........................ 395/500.03
5,831,451  11/1998  Bosshart ..................................... 326/93

OTHER PUBLICATIONS

B. Davari et al., "CMOS Scaling . . . " IEEE, vol. 83, No. 4, Apr. 1995.
J. Kao et al., "Transistor Sizing . . . ", DAC '97, Anaheim, CA., Mar. 1997.
K. Chu et al., "A Comparison of CMOS . . . ", IEEE Journal Solid State Circuits, Aug. 1987, pp. 528–532.
F. Lai et al., "Design & Implementation . . . ", IEEE Journal Solid State Circuits, vol. 32, No. 4, Apr. 1997, p. 563.

*Primary Examiner*—Paul R. Lintz
*Assistant Examiner*—Vuthe Siek
*Attorney, Agent, or Firm*—F. Chau & Associates, LLP

[57] ABSTRACT

A differential cascode voltage switch circuit includes a plurality of devices wherein a portion of the plurality of devices have a low threshold voltage and a remainder of the plurality devices have a regular threshold voltage for providing a performance gain without a substantial increase in standby power wherein at least one device has regular threshold voltage between a supply voltage and a ground. A method of producing a multi-threshold voltage circuit includes the steps of defining between a supply voltage node and ground at least one regular threshold voltage device for producing a high resistance to reduce current leakage and defining low threshold voltage devices within the circuit for reducing leakage current.

19 Claims, 19 Drawing Sheets

Y = AB'CD' + A'B + A'C + A'D

MULTI-THRESHOLD-VOLTAGE DIFFERENTIAL CASCODE VOLTAGE SWITCH (DCVS) CIRCUITS

BACKGROUND OF THE INVENTION

1. Field of the Invention

This present invention relates to high performance and low power CMOS circuits and, more particularly, to multi-threshold-voltage differential cascode voltage switch (DCVS) circuits.

2. Description of the Related Art

The most commonly used approach to achieve a low power design is to reduce power supply voltage $V_{dd}$. However, in order to maintain performance, the threshold voltage ($V_t$) should also be scaled down so that the overdrive ($V_g-V_t$) remains large enough. The delay for an inverter is approximately proportional to $(V_{dd}-V_t)^{-\alpha}$, where $\alpha \approx 2$ for long channel MOSFET devices. A reduction of $V_t$ causes an exponential increase in the subthreshold leakage current. As $V_{dd}$ and $V_t$ are scaled down, the increased leakage power can begin to dominate the dynamic switching power.

Differential cascode voltage switch (DCVS) logic is a dual-rail CMOS circuit technique which has advantages over single-rail traditional logic circuit techniques in terms of circuit delay, layout area and logic flexibility. A further advantage to DCVS circuits is the fact that they can be readily designed for a complex Boolean logic function within single gate delay using straightforward procedures based on Karnaugh maps and tabular methods. The logic function may also be synthesized. Static DCVS circuits may consume more power, however, than traditional CMOS circuits because the charging and discharging times depend on the turn-on and the turn-off paths within the DCVS tree and these are generally not symmetrical. This asymmetry prolongs the period of current flow through the latch of the DCVS circuit during the transient state, thus increasing the power dissipation. Dynamic DCVS circuits, such as NORA and DOMINO circuits, often suffer from accidental current discharge due to mismatches in pulldown times for drain nodes.

DCVS logic offers the opportunity to realize faster circuits than are possible with conventional forms of CMOS logic, but the speed advantage is gained at the expense of power consumption and accidental discharge. Therefore, a need exists for a DCVS circuit having low leakage and power dissipation, yet providing the increased speed over traditional CMOS logic circuits.

SUMMARY OF THE INVENTION

A differential cascode voltage switch circuit includes a plurality of devices wherein a portion of the plurality of devices have a low threshold voltage and a remainder of the plurality devices have a regular threshold voltage for providing a performance gain without a substantial increase in standby power wherein at least one device has a regular threshold voltage between a supply voltage and a ground. To further reduce the leakage current, low threshold voltage devices are preferably reverse biased in a standby state. The differential cascode voltage switch circuit may be a static circuit or a dynamic circuit. Dynamic circuits may include Domino circuits or NORA circuits.

The differential cascode voltage switch circuit may be a dynamic circuit having a DCVS tree structure with low threshold voltage devices and regular threshold voltage clock devices or having a DCVS tree structure with mixed threshold voltage devices and regular threshold voltage clock devices. The plurality of devices may preferably be metal oxide field effect transistors (MOSFETs). The plurality of devices may include an adder circuit.

A method of producing a multi-threshold voltage circuit comprising the steps of defining between a supply voltage node and ground at least one regular threshold voltage device for producing a high resistance to reduce current leakage, and defining low threshold voltage devices within the circuit for reducing leakage current. The step of defining low threshold voltage devices may include reverse biasing the low threshold voltage devices in off states.

The method of producing a multi-threshold voltage circuit may further include the step of determining voltage levels of internal nodes using standby input conditions and then defining a low threshold voltage device between source nodes and drain nodes having the same voltage level, defining a regular threshold voltage device between source nodes and drain nodes having the different voltage levels and defining either a low threshold voltage device or a regular threshold voltage device between source nodes and drain nodes having at least one undetermined voltage level based on design rules and minimum criteria. The steps of simulating performances of various circuit configurations, selecting configurations based on minimum criteria of speed and leakage current and selecting an optimum configuration of each circuit meeting minimum criteria may also be included.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention relates to low power high performance circuits, and more particularly to multi-threshold voltage ($V_t$) differential cascode voltage switch (DCVS) circuits for high speed and low power dissipation. Based on a mixed $V_t$ approach, performance may be achieved while maintaining a low leakage power for DCVS circuits. Several circuits within the DCVS family are described including dynamic versions of DCVS circuits having multi-threshold voltage circuits. A method for selecting low $V_t$ devices is also described.

Figure 1:
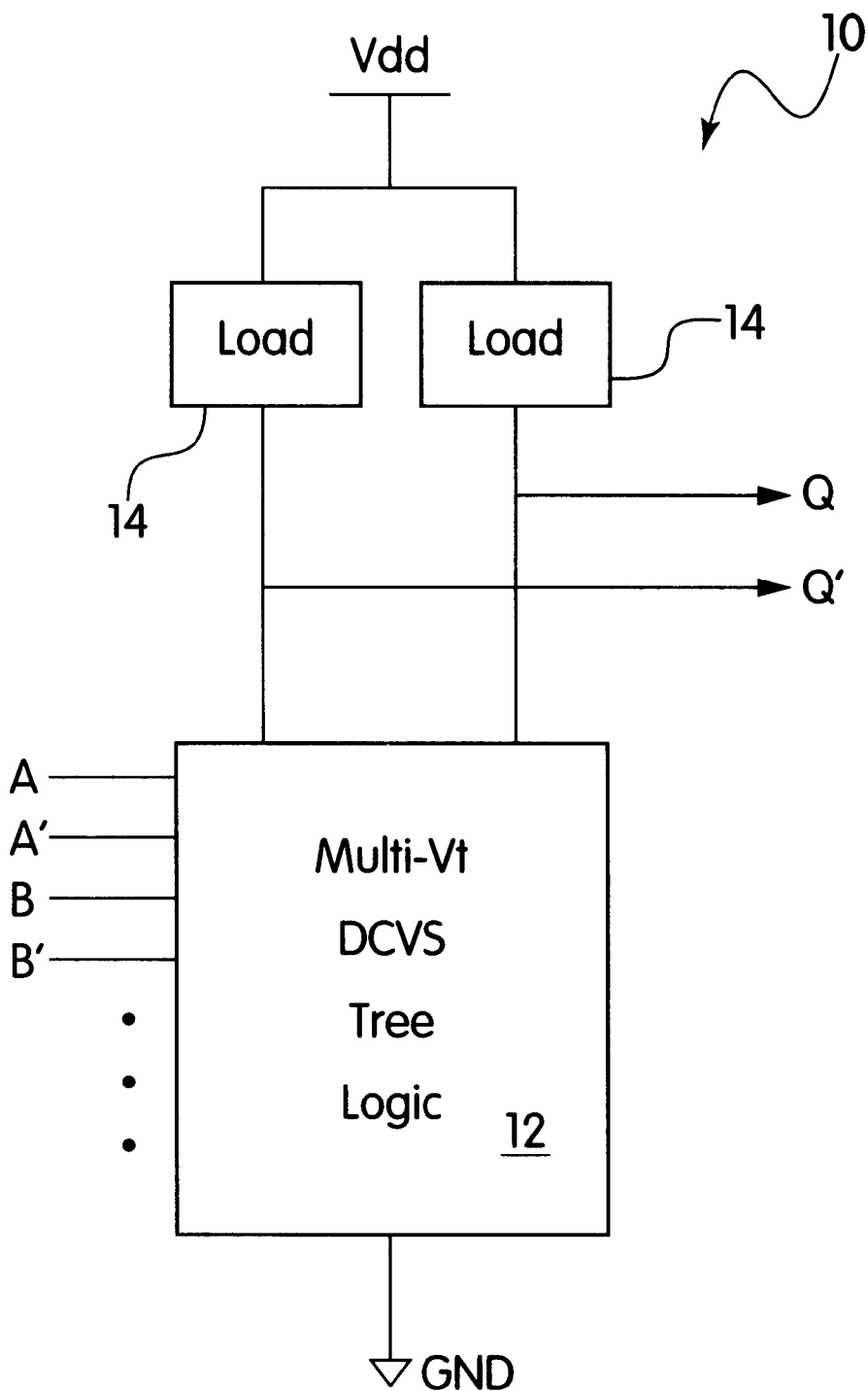
FIG. 1 is a block diagram of a basic multi-$V_t$ DCVS circuit in accordance with the present invention.

Referring now in specific detail to the drawings in which like reference numerals identify similar or identical elements throughout the several views, and initially to FIG. 1, a multi-threshold voltage DCVS circuit 10 structure is illustrated. The multi-threshold voltage DCVS circuit includes a multi-$V_t$ DCVS tree logic block 12 and a loading circuitry 14. Both true and complement outputs (Q and Q') are generated. One important characteristic of the multi-$V_t$ DCVS tree logic block 12 is the mixed use of both low-$V_t$ and regular $V_t$ devices. Low-$V_t$ devices are used to gain speed, and regular $V_t$ devices are used to keep the leakage current low. Using a mixture of low and regular $V_t$ devices provides the advantage of gaining speed while keeping the leakage current low. Circuit 10 may have any number of inputs for example, A, A', B, B', etc., and can be designed to perform any logic function for example, a sum and carry function in an adder.

Figure 2:
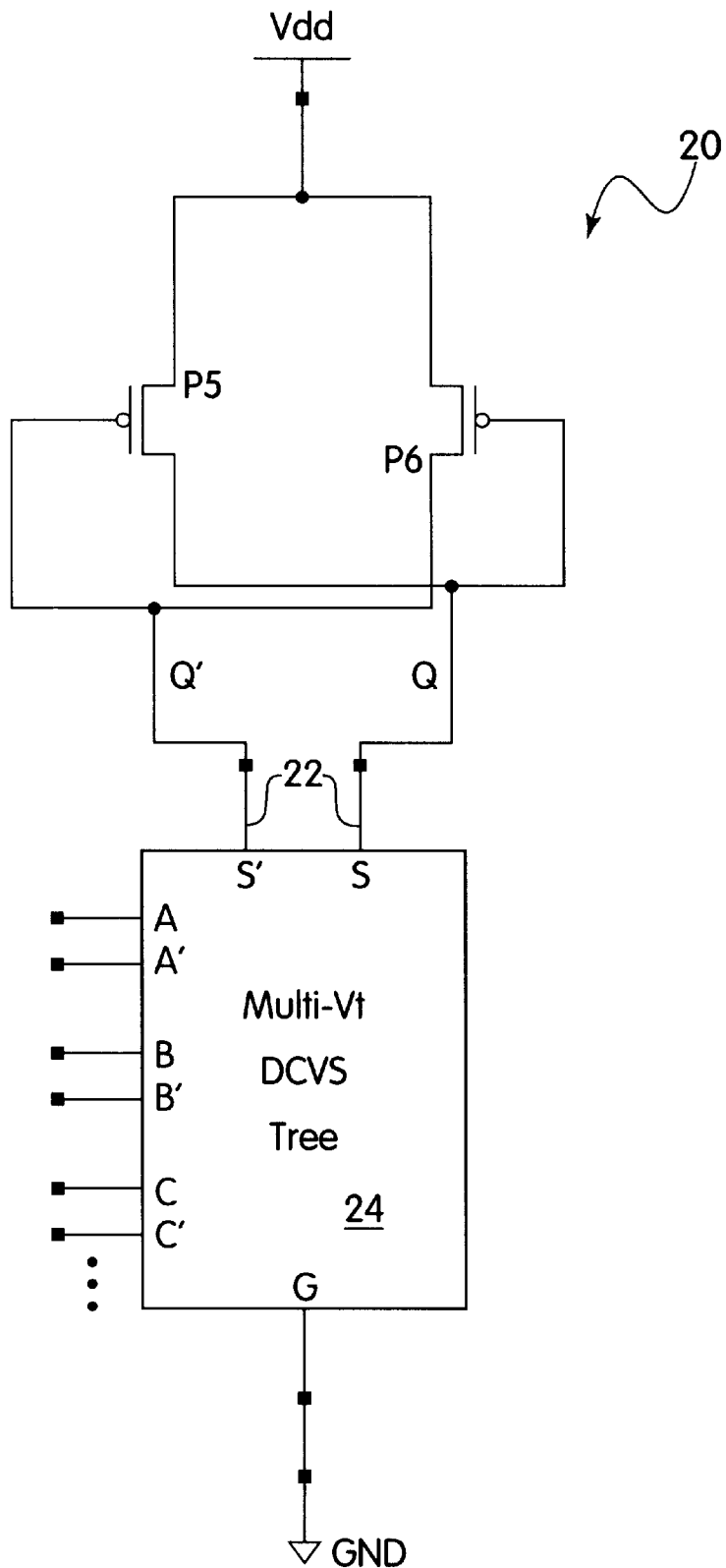
FIG. 2 is a schematic diagram of a multi-$V_t$ DCVS circuit in accordance with the present invention.

Referring to FIG. 2, a static multi-$V_t$ DCVS circuit 20 is shown. In static multi-$V_t$ DCVS circuit 20, cross-coupled PFETs P5 and P6 are used as a half-latch for the loading circuitry. Dual-rail outputs 22 of a multi-$V_t$ DCVS tree (logic tree) 24 are connected to Q and Q'. Depending on differential inputs A, A', B, B', etc., either node Q or Q' is pulled down by multi-$V_t$ DCVS circuit 20. In the static state, the logic tree 24 does not pass any direct current except the residue leakage current after the latch sets (P5 and P6). PFETs P5 and P6 have a regular $V_t$ and are normally used for loading to minimize the leakage current to $V_{dd}$. In cases where the leakage current to $V_{dd}$ is not important, low $V_t$ PFETs may be used for loading.

A single-rail CMOS static logic gate includes two parts: an NFET logic tree and a complement PFET load. The constructions of this logic gate are:

1. Each input is connected to the gate of both an NFET and a PFET.
2. The PFET and NFET circuits are complementary to each other.

3. A gate with N inputs requires a total of 2N transistors (FETs).

A dual-rail DCVS static logic gate comprises two parts: an NFET logic tree and a PFET cross-coupled latch load only. Thus a DCVS gate with N input variables requires only N+2 transistors (FETs). Hence, the circuit area, the device count and the power may be reduced in the DCVS logic gate. Further details of the multi-threshold voltage circuits will be described herein.

Figure 3A:
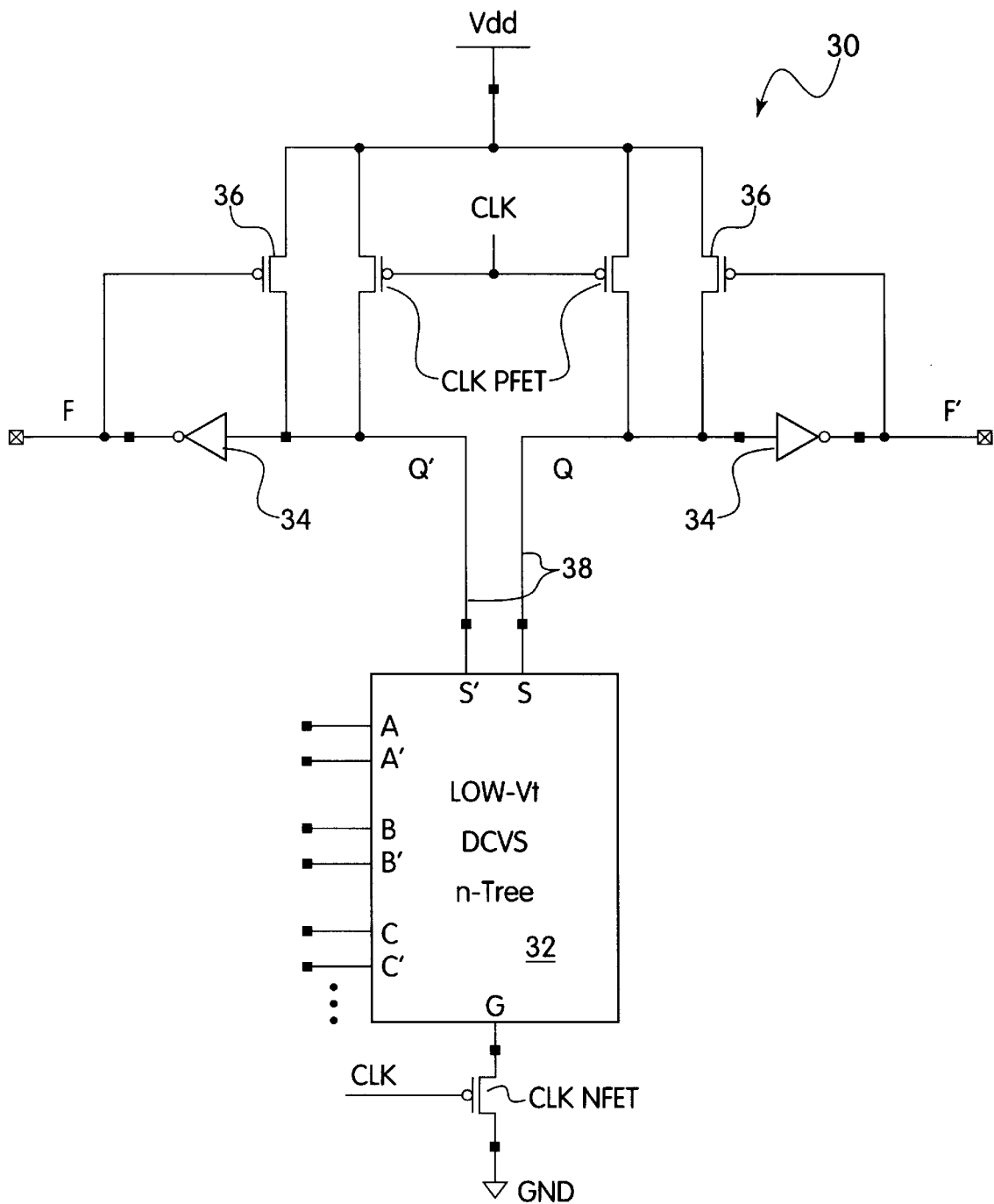
FIG. 3A is a schematic diagram of a DOMINO multi-$V_t$ DCVS circuit having a low $V_t$ DCVS logic tree with regular $V_t$ clock transistors in accordance with the present invention.
Figure 3B:
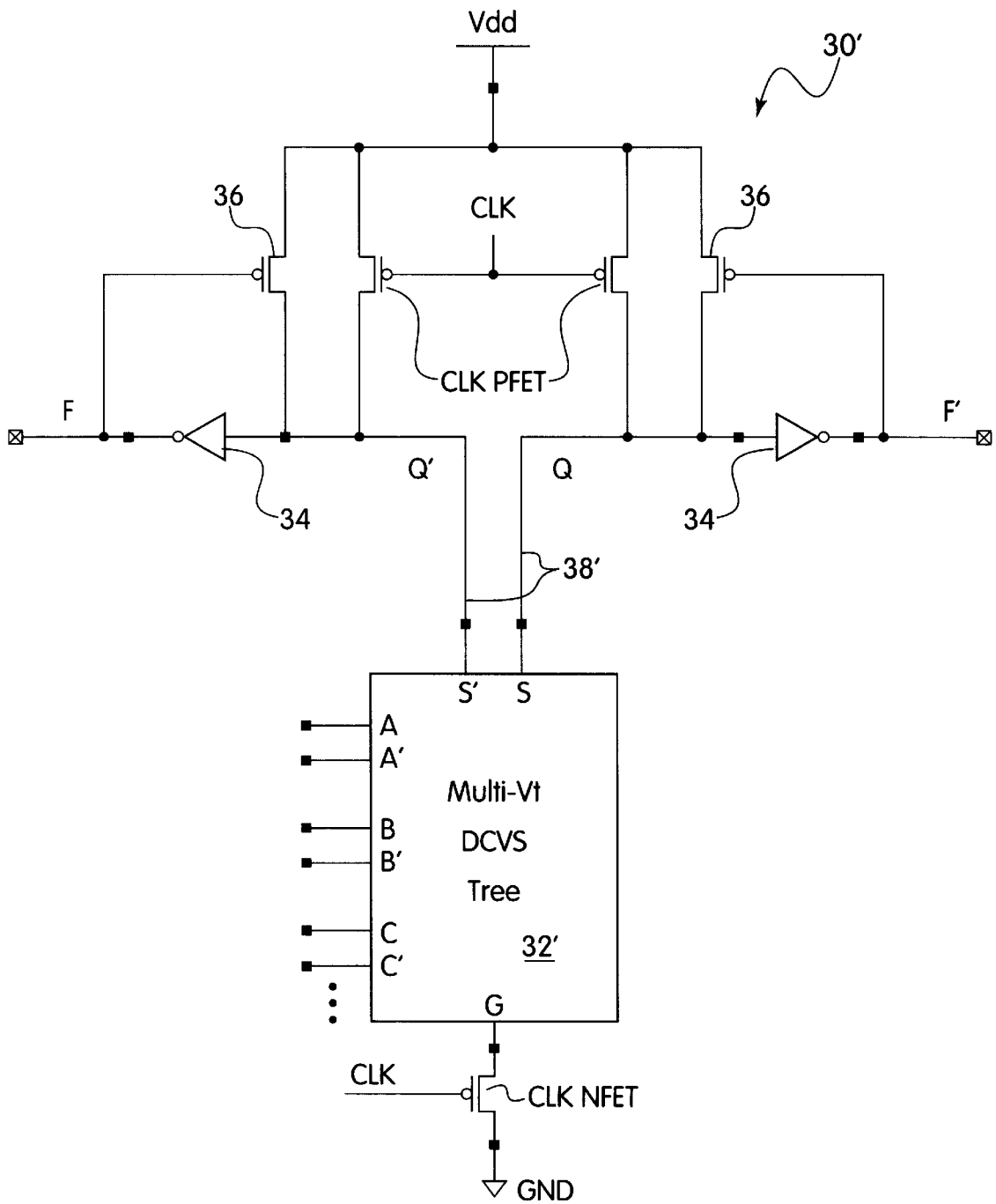
FIG. 3B is a schematic diagram of a DOMINO multi-$V_t$ DCVS circuit having a multi-$V_t$ DCVS logic tree with regular $V_t$ clock transistors in accordance with the present invention.
Figure 3C:
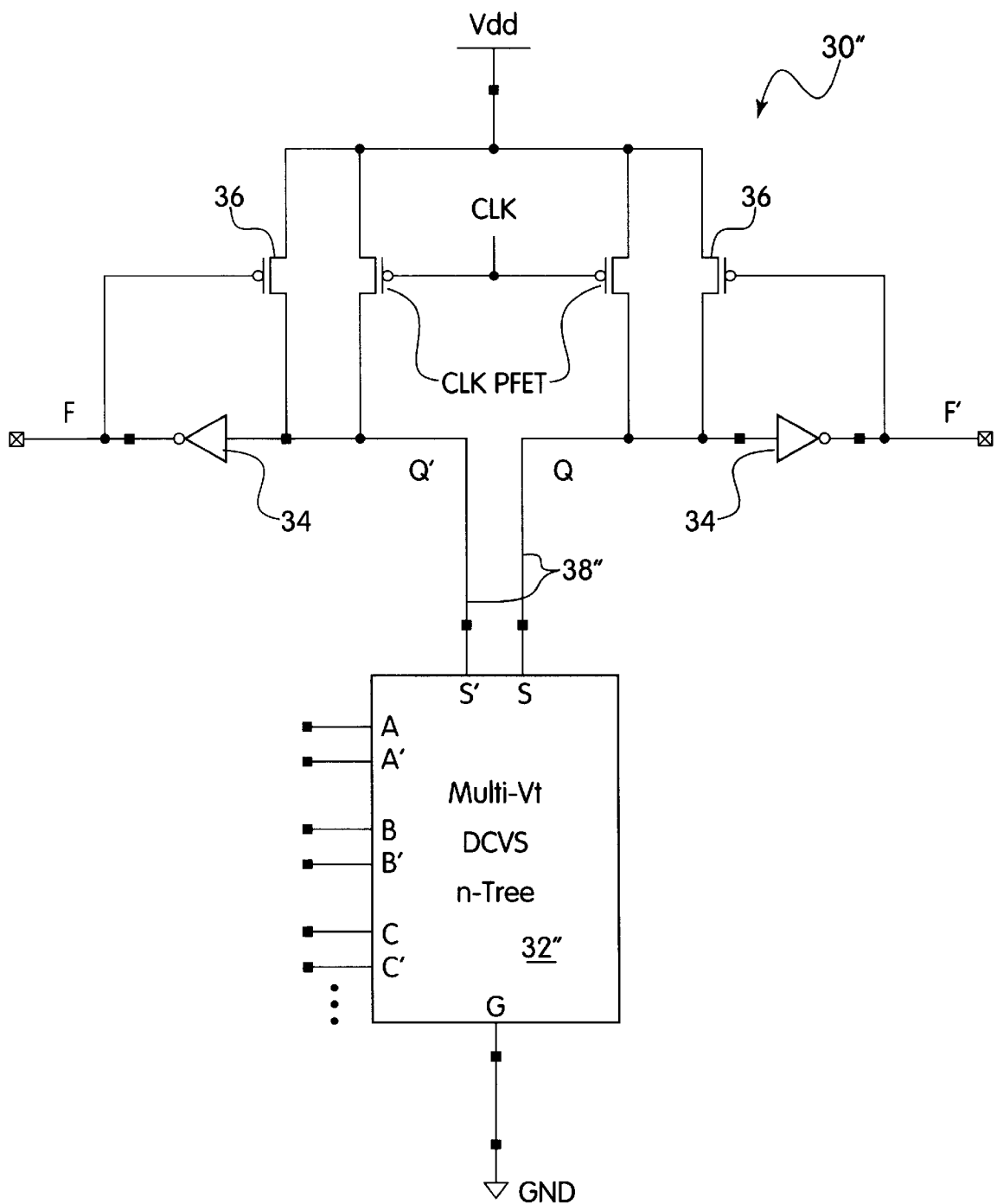
FIG. 3C is a schematic diagram of a DOMINO multi-$V_t$ DCVS circuit having a "footless" multi-$V_t$ DCVS logic tree with regular $V_t$ clock transistors in accordance with the present invention.

Referring to FIGS. 3A–C, DOMINO versions of multi-threshold voltage circuits 30 are shown. For dynamic versions of the DCVS gate, the dual-rail outputs 38 (FIG. 3A) may generate true and complement (either HIGH or LOW) signals, F and F-complement. The F and F-complement connect to an OR gate (not shown) to develop a "DONE" signal. A CLK signal represents a "START" signal and goes HIGH, signaling the initiation of a cycle. An NFET pull-down network is evaluated and one of the precharged nodes is lowered with the corresponding output going HIGH. To achieve a high speed microprocessor design, dynamic DCVS circuits are often used. As shown in FIG. 3A, a low-$V_t$ DCVS n-tree block 32 is used to gain speed and regular $V_t$ clock NFET (labeled as CLK NFET) is used to cut down the standby leakage current. Inverters 34 are used at the DCVS circuit output to allow signal cascade along the domino chain. PFET keeper devices 36 are used to help pull down F and F' (F-complement) nodes during a precharge period. The width of keepers 36 are normally about one tenth of the CLK PFETs. An alternate embodiment is shown in FIG. 3B, where a multi-$V_t$ DCVS tree 32' is used to gain speed and to cut down the leakage current. An application of this type of circuit to a "footless" DOMINO circuit is shown in FIG. 3C. In this case, a multi-$V_t$ DCVS tree 32" is used to minimize the leakage current.

Figure 4A:
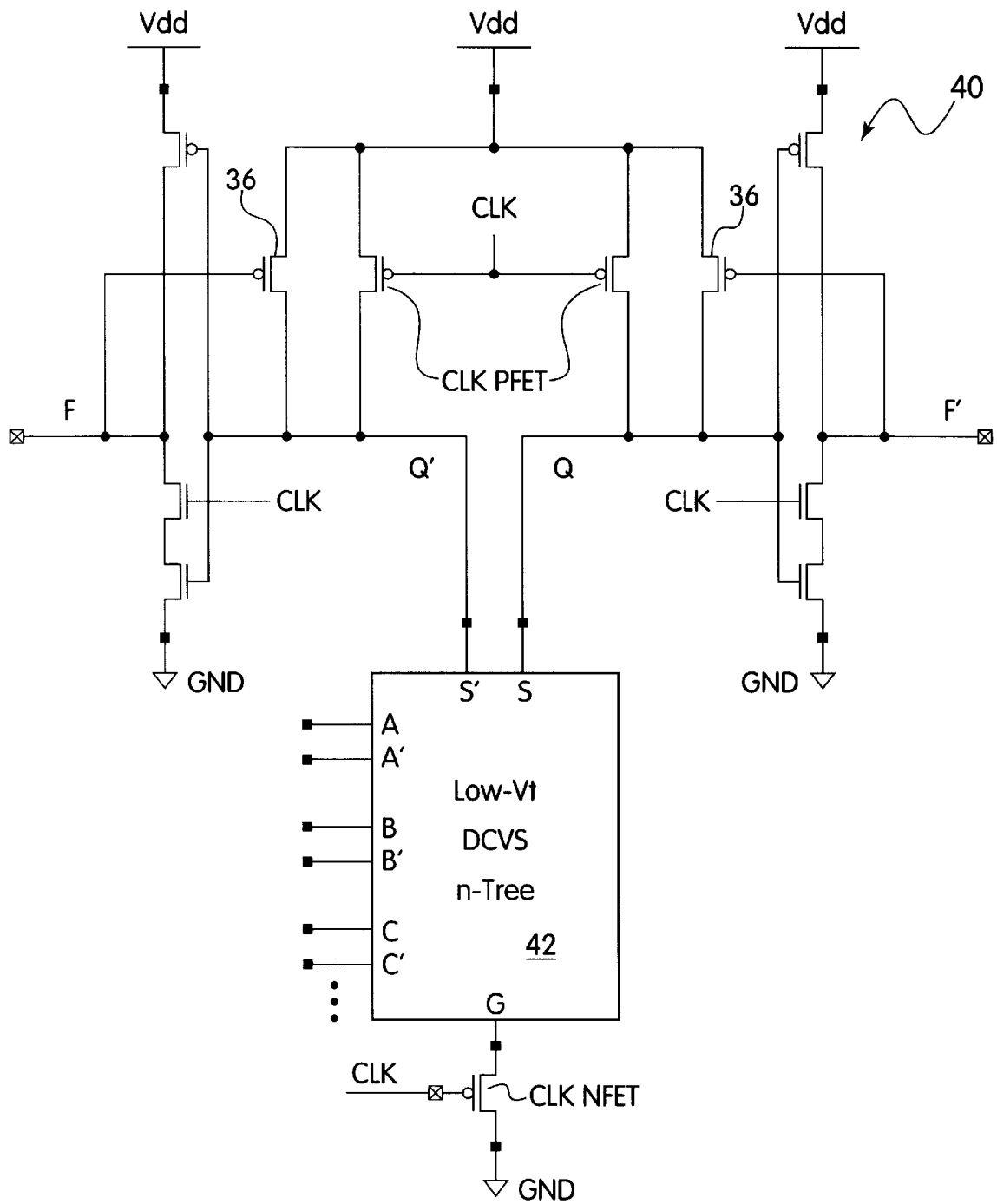
FIG. 4A is a schematic diagram of a NORA multi-$V_t$ DCVS circuit having a low $V_t$ DCVS logic tree with regular $V_t$ clock transistors in accordance with the present invention.
Figure 4B:
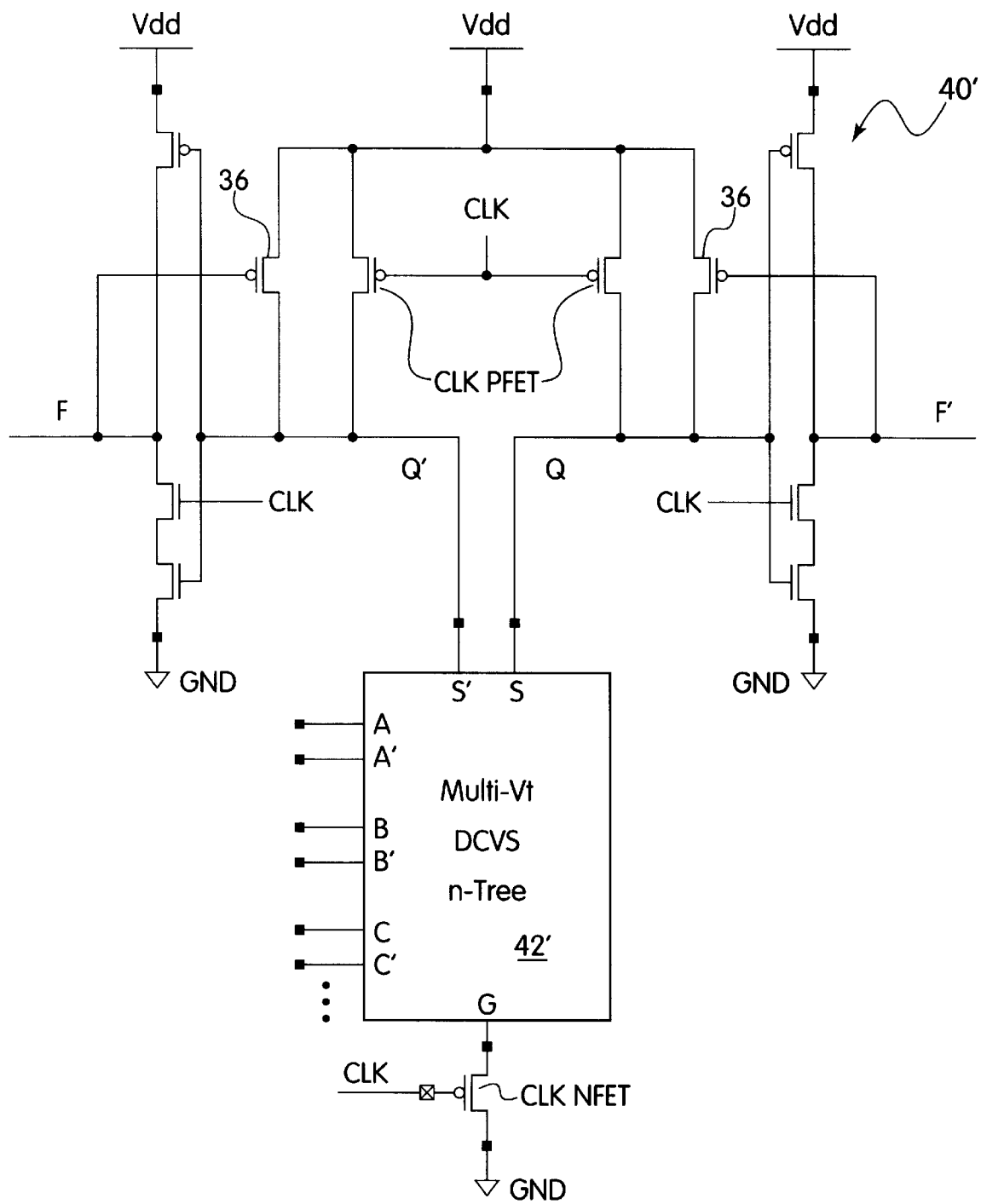
FIG. 4B is a schematic diagram of a NORA multi-$V_t$ DCVS circuit having a multi-$V_t$ DCVS logic tree with regular $V_t$ clock transistors in accordance with the present invention.
Figure 4C:
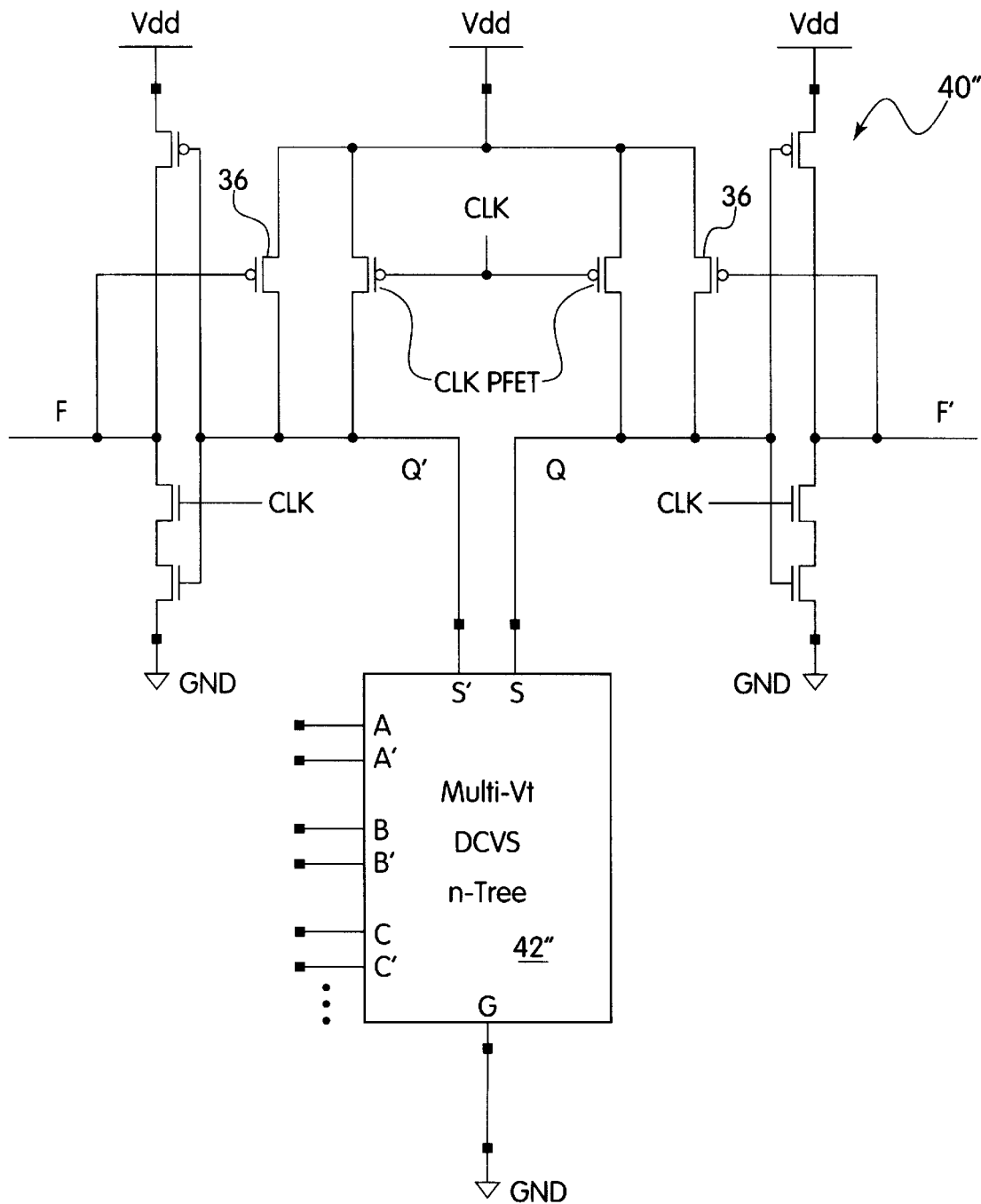
FIG. 4C is a schematic diagram of a NORA multi-$V_t$ DCVS circuit having a "footless" multi-$V_t$ DCVS logic tree with regular $V_t$ clock transistors in accordance with the present invention.

Referring to FIGS. 4A–C, multi-$V_t$ DCVS NORA circuits 40 are shown. Similar to FIGS. 3A–C, FIG. 4A shows a low-$V_t$ DCVS tree 42 mixed with a regular $V_t$ clock NFET shown as CLK. FIG. 4B shows the case in which a multi-$V_t$ DCVS tree 42' is used, and FIG. 4C shows the case of a "footless" multi-$V_t$ DCVS NORA circuit 42".

Figure 5A:
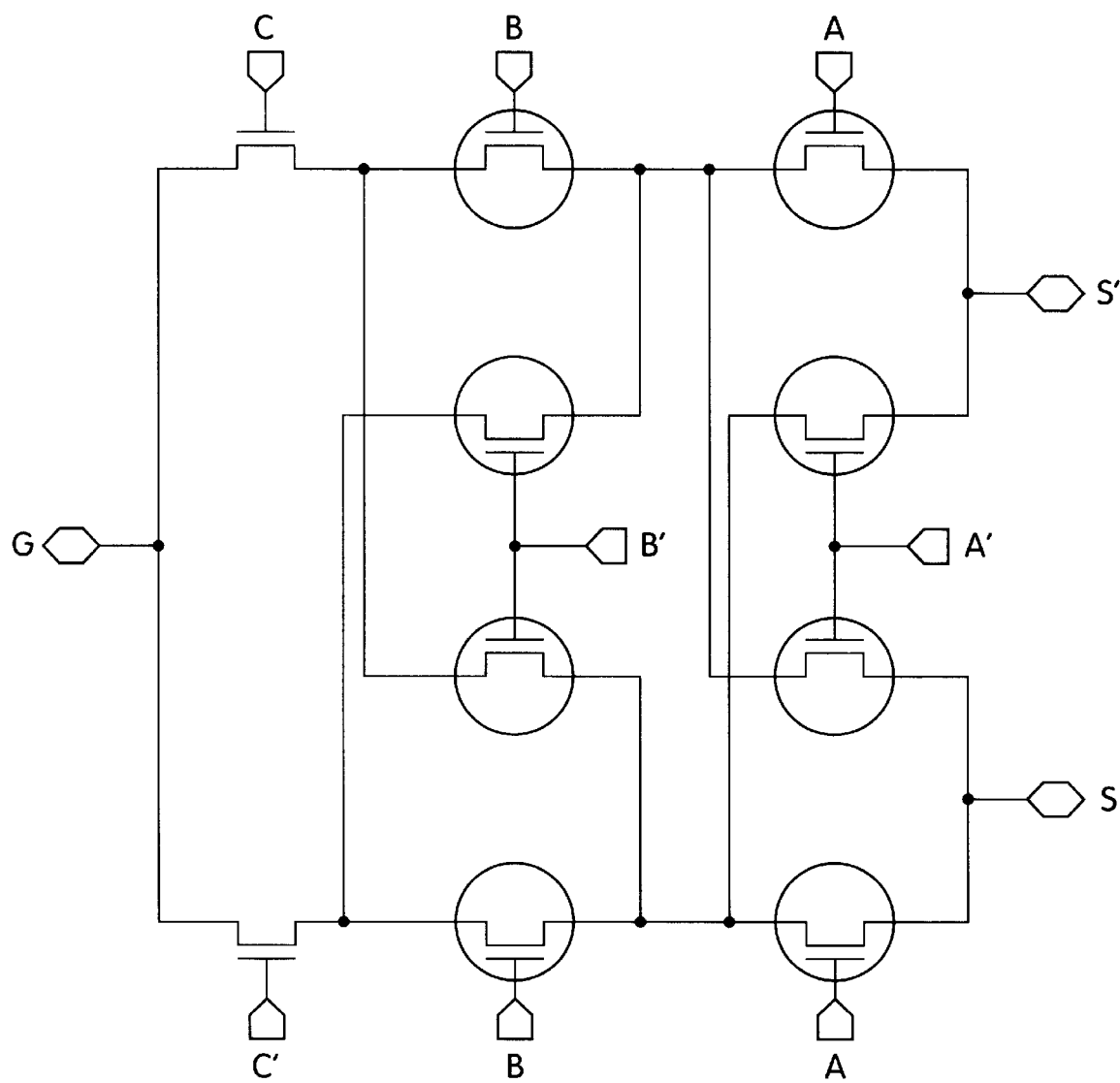
FIGS. 5A–D are schematic diagrams of various logic circuits having multi-$V_t$ devices mixed in accordance with the present invention.
Figure 5B:
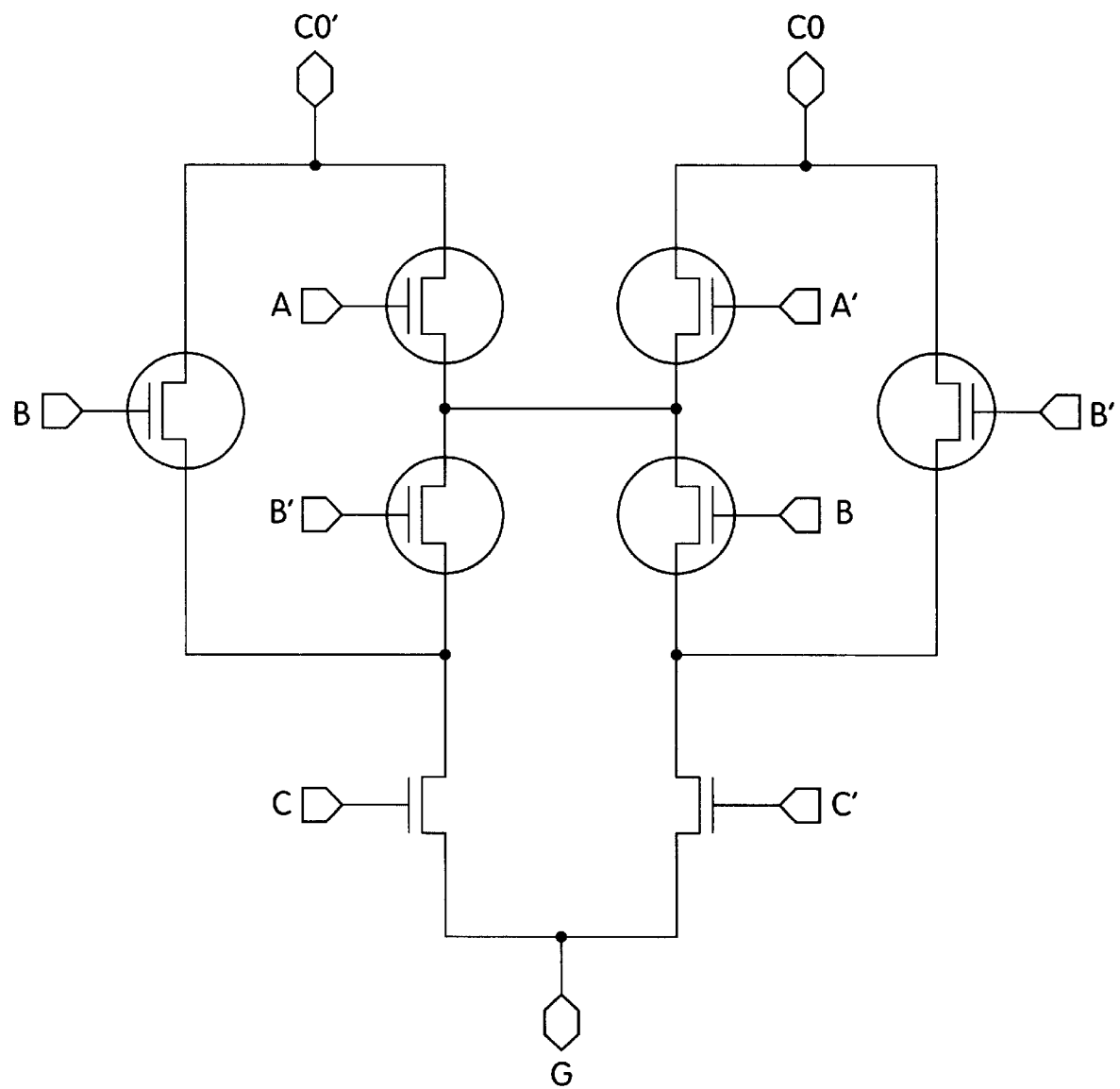
Figure 5C:
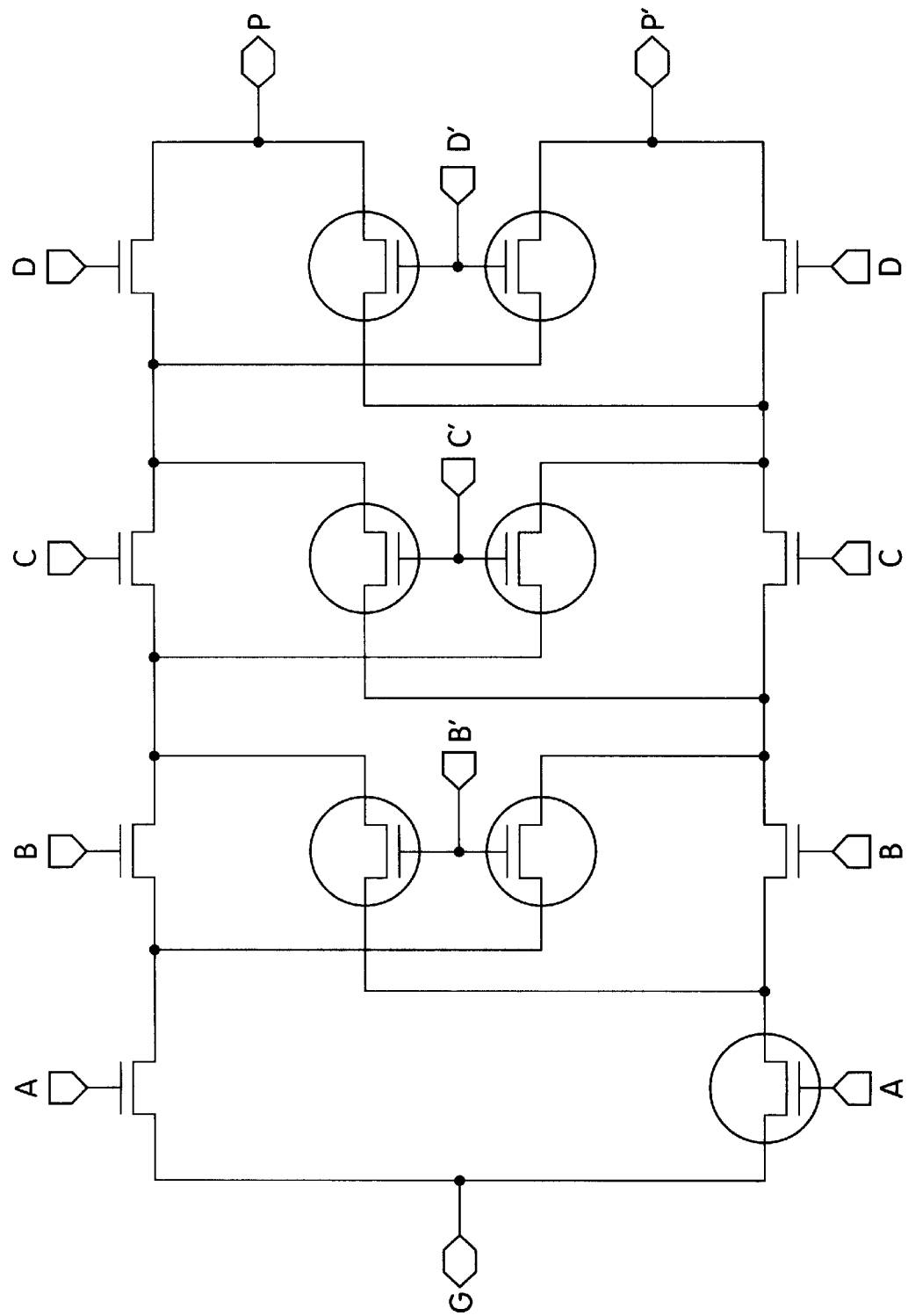
Figure 5D:
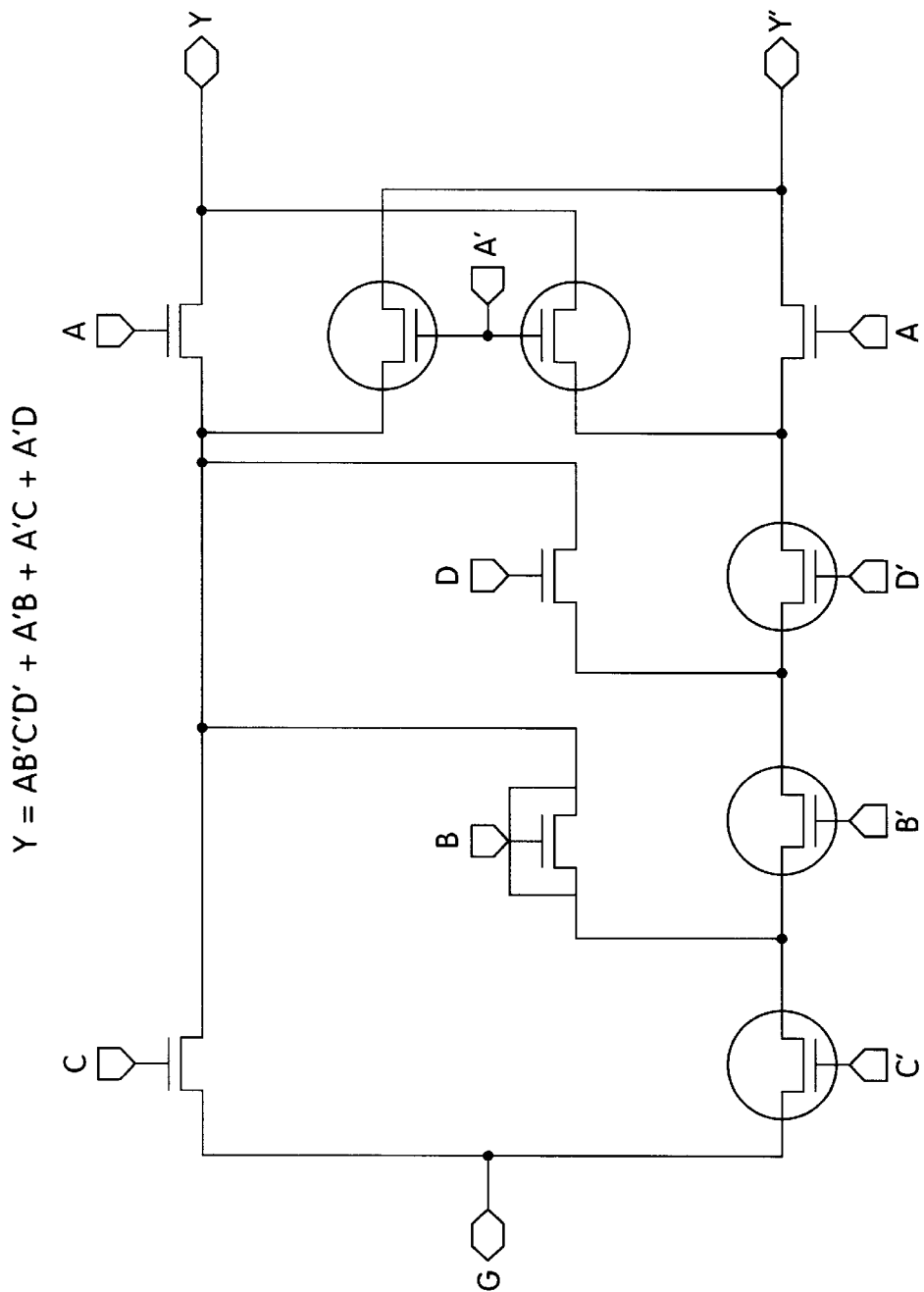

Referring now to FIGS. 5A–D, embodiments of a multi-$V_t$ DCVS tree are illustrated. FIGS. 5A and 5B are circuits designated for a sum and carry operation in a 1-bit adder. The Boolean functions for the circuits shown in FIGS. 5A and 5B are SUM=AB'C'+A'B'C+A'BC'+ABC and CARRY=AB+BC+AC. FIG. 5C is a 4-way parity function. FIG. 5D is an arbitrarily chosen Boolean function (Y=AB'C'D'+A'B+A'C+A'D). As a convention, the low $V_t$ MOSFETs are circled and labeled with symbol 1. A', B', C' and D' are complements of A, B, C, and D, respectively. FIGS. 5A–D collectively illustrate examples of the implementation of mixing low $V_t$ devices with regular or high $V_t$ devices.

FIGS. 5A–D are not exclusive in that one skilled in the art may conceive of other circuits that may benefit from reduced leakage current and higher performance as achieved by mixing low and regular/high $V_t$ devices.

To appropriately select which devices should be low $V_t$ and which should be high/regular $V_t$ devices for the above multi $V_t$ DCVS tree structures of FIGS. 5A–D, an algorithm can be applied. General steps of this algorithm include: (1) recursively applying the Karnaugh-map method to get the standard DCVS tree structure for regular $V_t$ devices and then (2) applying an optimization algorithm as described below to select which devices should be made low $V_t$ in order to gain speed while minimizing the leakage current.

The optimization algorithm converts arbitrary regular $V_t$ circuits into mixed $V_t$ logic circuits which perform the same logic and are optimized for speed, leakage current and power criteria. This optimization algorithm forms the foundation for mixed $V_t$ computer optimization programs. The optimization criteria are composed of two main factors: speed, standby power and can be extended to cover other factors for example, up/down switching, short-circuit power and transient switching power. One criterion can be set forth, that no single path from $V_{dd}$ to ground can be made of all low $V_t$ devices without at least one regular $V_t$ device. A more restrictive criterion is to search all possible paths from the outputs to either ground or $V_{dd}$ and no single path should be made exclusively with low $V_t$ devices. Another important criterion is that the most critical path in the logic tree should be made from mostly low $V_t$ devices.

The method includes reverse biasing devices selected for low $V_t$. The low $V_t$ devices may be made to reverse bias themselves in the standby state where possible. By placing a regular $V_t$ device in the appropriate position in a circuit the low $V_t$ devices surrounding the regular $V_t$ device may be reverse biased in their standby state. This reverse bias ($V_{gs}$, where g stands for gate and s stands for source) is usually of the order of the difference of the two threshold voltages (regular $V_t$–low $V_t$). Typically, they are of the order of 100 mV. Negative $V_{gs}$ can dramatically cut off the leakage current of the low $V_t$ devices, by an order of magnitude, owing to the exponential dependence of the leakage current to $V_{gs}$. For a dummy technology, for example, we have decreased the leakage current by a factor of about 7 by having a reverse bias of about 100 mV.

The optimization algorithm includes the following steps:

STEP 1: Rules of Construction

Rule 1.1: No single path between $V_{dd}$ and ground can be made entirely of low $V_t$ devices.

Rule 1.2: No single path between output and ground can be made entirely of low $V_t$ devices.

Rule 1.3: No single path between output and $V_{dd}$ can be made entirely of low $V_t$ devices.

Rule 1.4 (recommended): The devices that are connected to $V_{dd}$ and ground should be regular $V_t$ devices.

Rule 1.5: The low $V_t$ device is preferably reverse biased in its off state, whenever possible.

STEP 2: Criteria

Rule 2.1: Speed gain of the circuit must be greater than the minimum speed gain set by a designer of the circuit.

Rule 2.2: Leakage current in the circuit must be less than the leakage current limit set by the designer.

Rule 2.3 (optional): If a cost function is defined, the value of the cost function must be smaller than the cost function limit set by the designer. A cost function is defined to reflect the trade-off between performance, speed, leakage current, processing complexity and yield issue.

Rule 2.4: A merit function is defined by the designer and tool developer to reflect the overall rating of the configuration. The merit functions for each configuration is evaluated. For speed driven microprocessor design, for example, a preferred choice for merit function is −(slack) or −(slack)/((leakage current increase)$^\gamma$+η (cost function)), where γ and η are parameters. The latter definition is essentially an extension of the slack definition which accounts for leakage current increase and cost function. It reduces to −(slack)/2 when γ and η=0. A slack is conventionally defined as the arrival time minus required arrival time, and it applies to both early-mode and late-mode analysis.

STEP 3: Optimization Procedures

For small circuits, all the configurations that are passed STEP 1 and STEP 2 may be simulated to determine the best configuration with maximum value of merit function. For very large circuits, such exhaustive simulations are too time consuming. The number of configurations increase as $2^N$-$M_1$-$M_2$, where N is the device count in the circuit and $M_{1,2}$ are the numbers screened out in STEP 1 and STEP 2.

An alternate optimization technique is to use static timing analysis to find all critical paths and to optimize each critical path until gain in the merit function is less than a predetermined number set by the designer.

In addition, some circuit properties can be used to simplify the optimization procedures. For example, for symmetric circuits where NFETs and PFETs are duals of each other, the number of configurations to be examined is reduced to $2^{N/2}$-$M_1$-$M_2$. In general, devices with similar properties can be grouped into a device group. For example, if a device group is made low $V_t$, all the devices in that group are made low $V_t$. The same is true for a regular $V_t$ group.

A stage approach also reduces the number of configurations needed to be examined. Transistors having sources or drains directly connected to ground or $V_{dd}$ are labeled as Stage 0. Transistors having sources or drains directly connected to Stage 0 are labeled as Stage 1, those connected to Stage 1 are labeled as Stage 2, etc. The last stage is the stage connected to the output, Stage N. An efficient way of converting regular $V_t$ circuits to mixed $V_t$ circuits is to convert the devices in the same stage as a device group to make them all low $V_t$ at the same time. The sequence of the conversion starts from Stage N and propagates to Stage 1. No devices in Stage 0 should be converted to low $V_t$ because this would violate Rule 1.5 of STEP 1. The number of configurations in this approach is reduced to the stage number N. This approach is particularly useful in the early phase of the design no concrete knowledge of the critical path is available, and it is very time-efficient.

STEP 4: Loop through STEPS 1 to 3 until satisfactory results are obtained.

Figure 6:
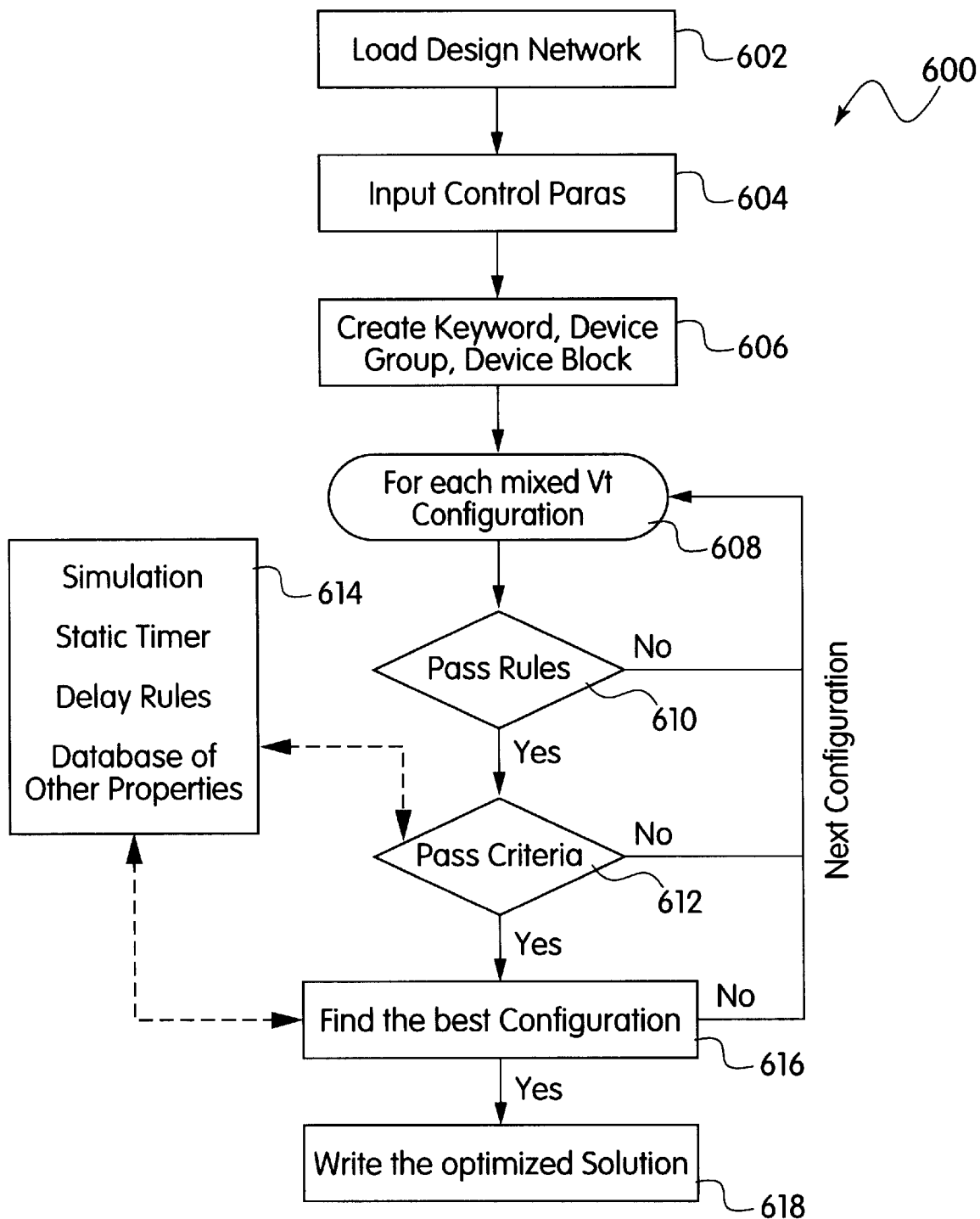
FIG. 6 is a flow chart for determining which devices may be defined as low $V_t$ devices in accordance with the present invention.

Referring to FIG. 6, a flow chart 600 for the above algorithm is shown. The process begins by loading the design network in function block 602. The control parameters are input in function block 604. To complete the initialization process, keyword, device group and device block are created in function block 606 by the designer. At this point, the process enters a processing loop which tests each configuration in sequence, as indicated in operation block 608. A test is made in decision block 610 to determine if the current configuration passes the rules. If not, the process loops back to operation block 608 to retrieve the next configuration to be tested. If the current configuration passes the rules, a test is made in decision block 612 to determine if the current configuration also passes the criteria. This is determined by simulation, static timer, delay rules and access to a database of other properties in block 614. If not, the process loops back to block 608 to retrieve the next configuration to be tested. If the current configuration passes the criteria, access is again made to block 614 by function block 616 to determine the best configuration. If a best configuration is not found, the process loops back to operation block 608 to retrieve the next configuration to be tested. When the best configuration is found, it is output as the optimized solution in function block 618.

As shown in FIGS. 5A and 5B, the above algorithm was utilized to make the devices in the upper-row and the middle-row low $V_t$ while keeping the bottom regular $V_t$. Using this method, the leakage current is decreased by a factor of between 1.5 to 2. If no prior knowledge of the standby state input pattern or critical path is known, the general approach described in the above algorithm can be used to select and compare different multi-$V_t$ structures. However, if we have some knowledge of standby state input patterns, a much more effective method for selecting low-$V_t$ devices can be applied to the DCVS tree block. It is as described below and FIGS. 5C and 5D show a examples of the multi-$V_t$ DCVS tree structures that are optimized by this method.

Figure 7A:
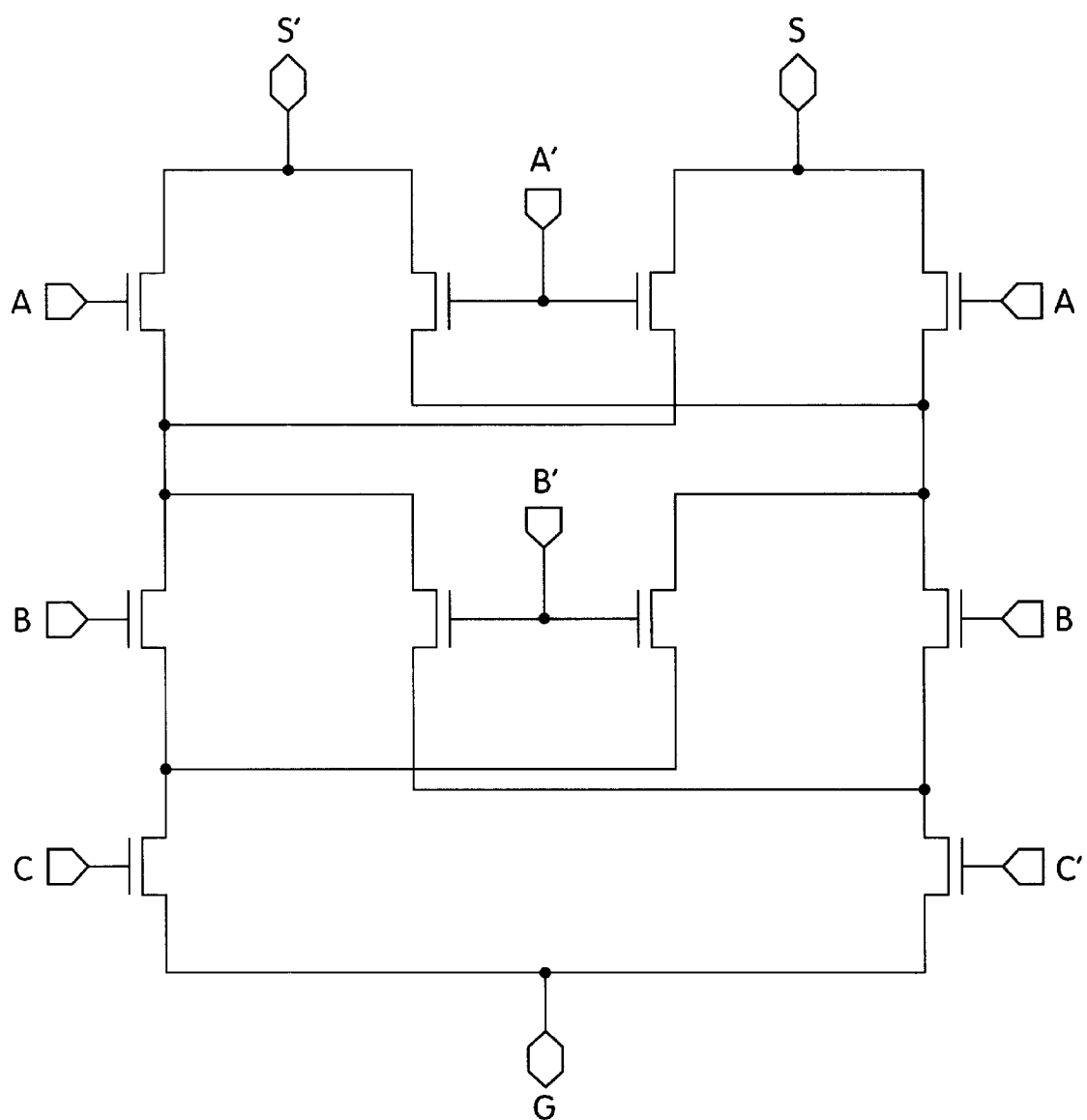
FIG. 7A is a schematic diagram of a DCVS circuit having regular $V_t$ devices in accordance with the present invention.
Figure 7B:
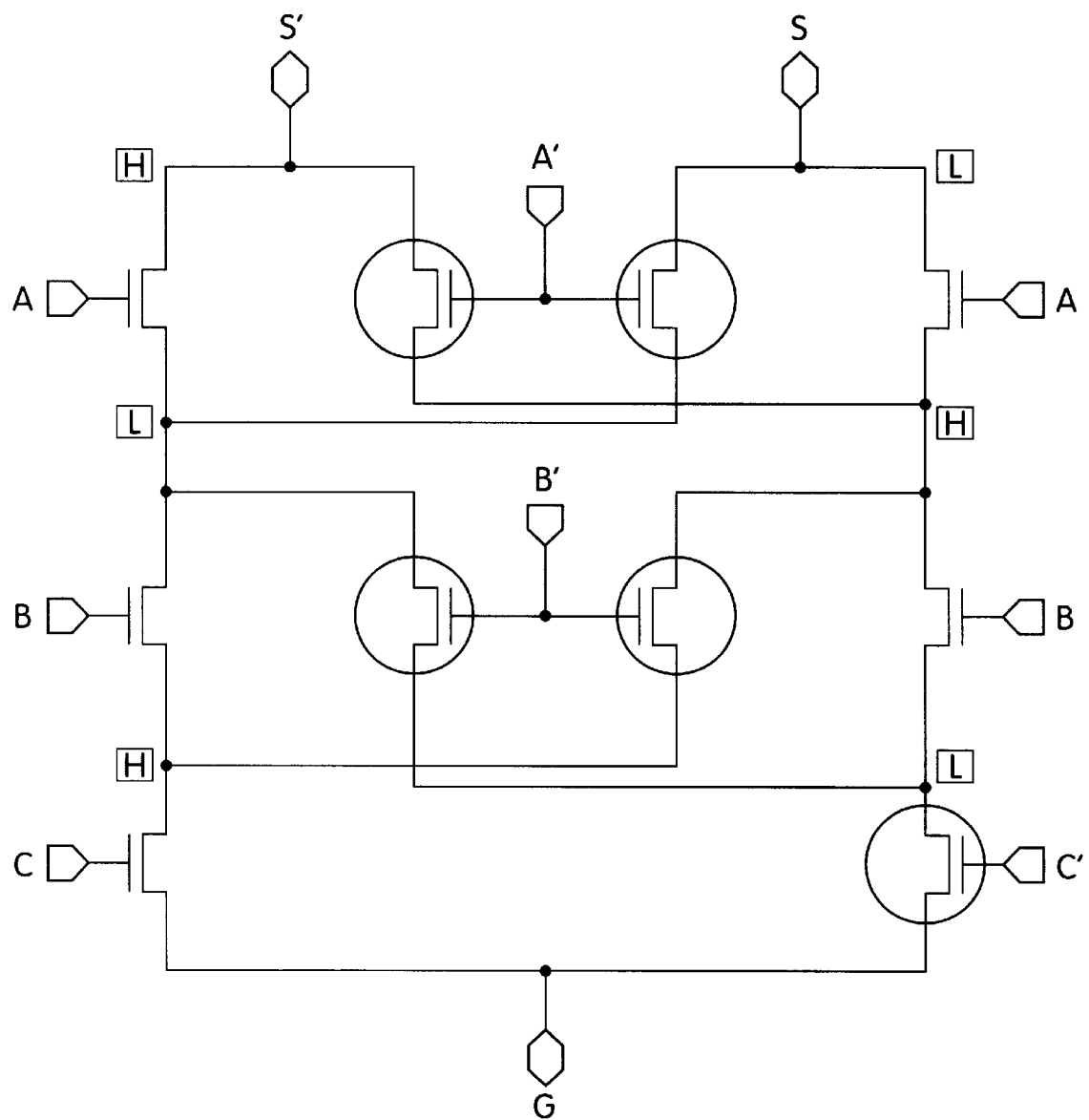
FIG. 7B is a schematic diagram of the DCVS circuit of FIG. 7A having regular $V_t$ and low $V_t$ devices mixed in accordance with the present invention.

In many applications, the standby state of the DCVS tree is known to be limited to a few input vectors or is known to be limited statistically to a few input vectors. A method can derive the best configuration mixed $V_t$ configuration from these input vectors. A SUM circuit shown in FIG. 7A is used to illustrate this method. The following notation will be used, 0 means low-voltage state, i.e. ground, often labeled as L, and 1 means high-voltage state, i.e. $V_{dd}$, often labeled as H. Suppose the input vector of the standby state of this circuit is known to be (ABC)=(000). We then have S=0 and S'=1 and (A'B'C')=(111). All the gates with inputs A', B', or C' will be on, and their source (s) and drain (d) will have equal voltage. Following in this way, as many internal nodes' voltage states as possible are determined and labeled as either L or H. This is indicated in FIG. 7B. (Note that the labels are enclosed in the squares). The general rules as described above are implemented: (1) between any L and H nodes at least one regular $V_t$ device with a source that should be connected to node L; and (2) between any L and L or H and H all devices can be made low-$V_t$ without affecting the standby state leakage current. The final result is shown in FIG. 7B for a circuit with mixed $V_t$ devices according to the present invention.

Figure 8A:
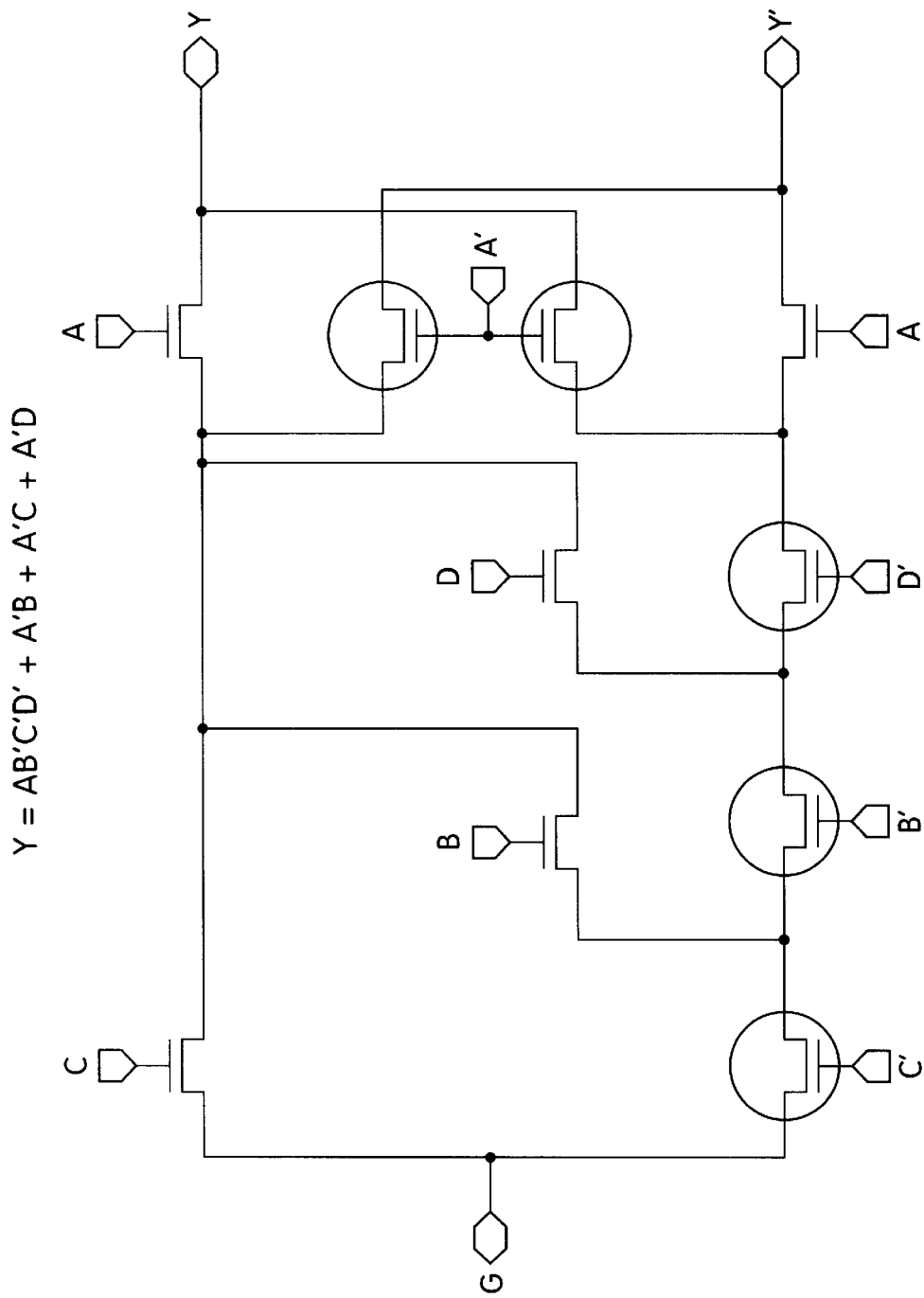
FIG. 8A is a schematic diagram of a DCVS circuit having regular $V_t$ devices in accordance with the present invention.
Figure 8B:
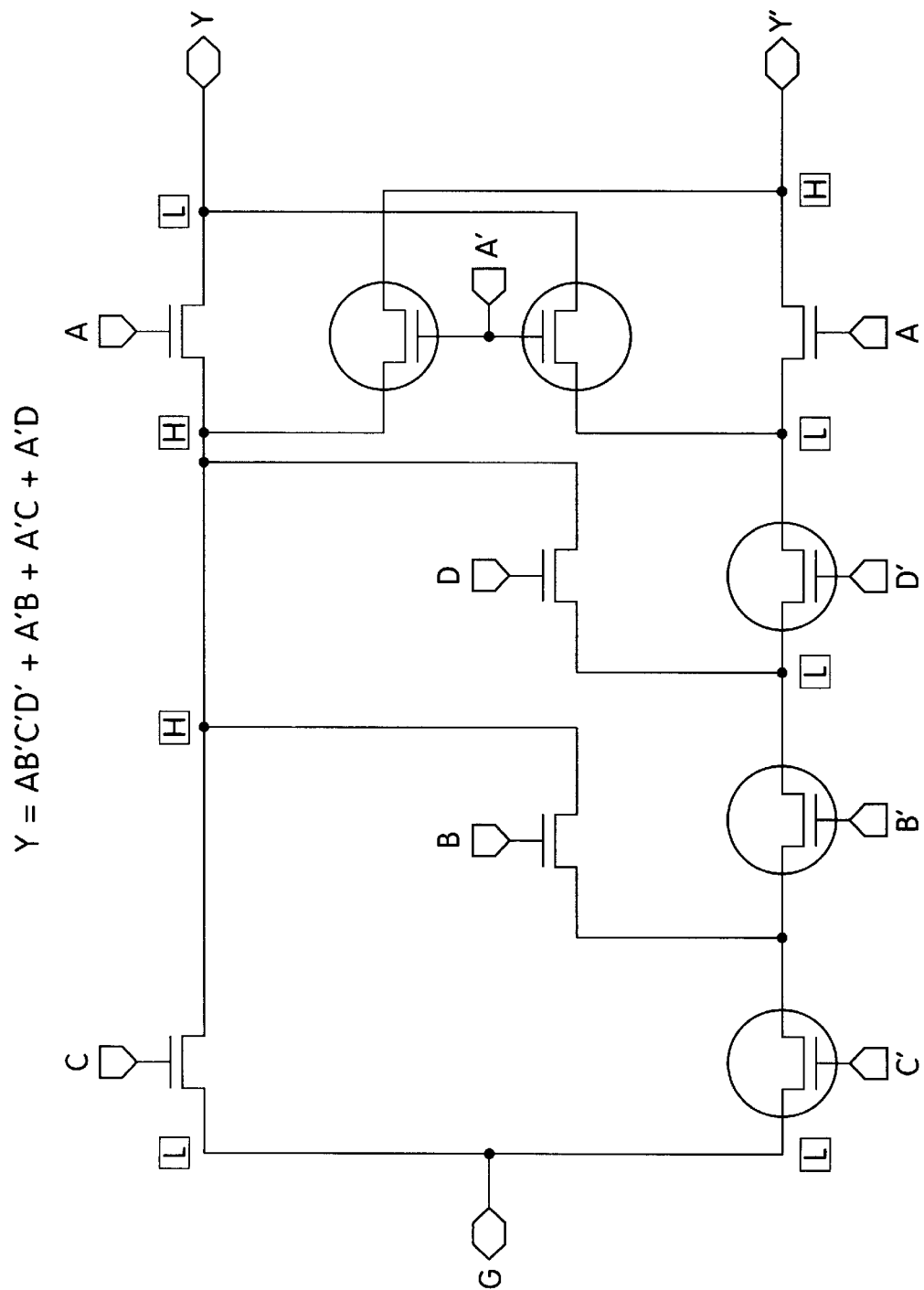
FIG. 8B is a schematic diagram of the DCVS circuit of FIG. 7A having regular $V_t$ and low $V_t$ devices mixed in accordance with the present invention.

This approach can be applied to any DCVS tree structure. Another example is shown in FIGS. 8A and 8B for Boolean function (Y=AB'C'D'+A'B+A'C+A'D). Suppose that a standby state input vector is known to be ABCD=0000. The final result is shown in FIG. 8B for a circuit with mixed $V_t$ devices according to the present invention.

Figure 9:
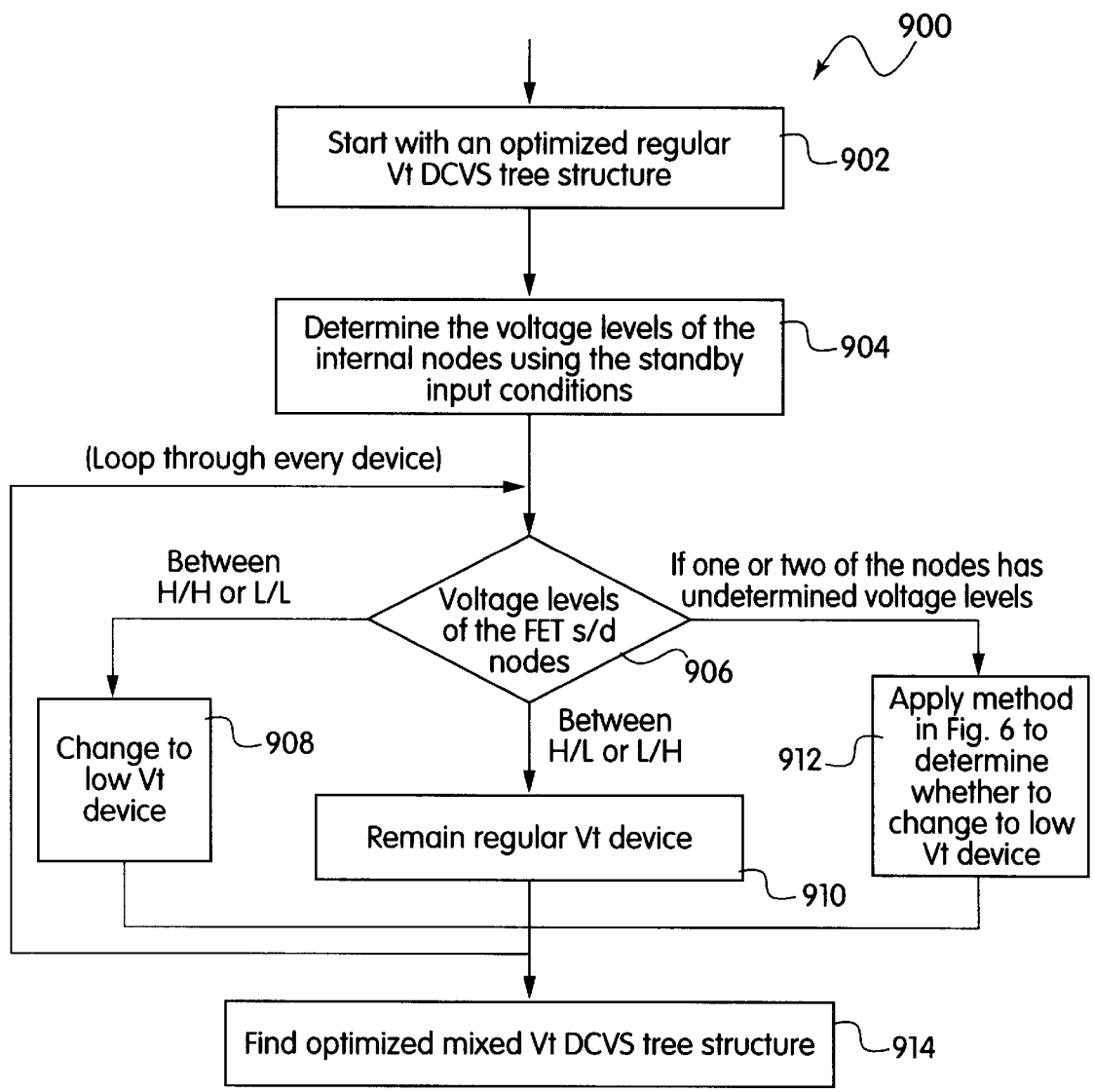
FIG. 9 is a flow chart for optimizing multi-$V_t$ DCVS trees in accordance with the present invention.

Referring to FIG. 9, a flow chart 900 is shown. A regular $V_t$ DCVS tree structure is defined by recursively applying a Karnaugh map (K-map) method in function block 902. A standby-state input pattern is applied to the tree to determine the voltages of the internal nodes in function block 904. Function block 904 also includes labeling the internal nodes (L and H). Decision block 906 determines the appropriate action to take when voltage levels of the current device are known. A device between H and H or L and L nodes is changed to a low $V_t$ device in function block 908. A device between H and L or L and H nodes remains a regular $V_t$ device in function block 910. The location of regular $V_t$ devices is such that its source is connected to the L node. If one or two of the nodes has an undetermined voltage level the algorithm of flow chart 600 in FIG. 6 is used to determine if a low $V_t$ device is permitted and preferred in function block 912. Decision block 906 is applied to each device in the tree structure prior to employing function block 914. Function block 914 can use simulations or other techniques to determine the best configuration of low and regular $V_t$ devices. These configurations are often called degenerate configurations.

To generalize the above method to (1) cases in which there are multiple input vectors in its standby state, and (2) cases in which all that is known is the statistical patterns/ probabilities of the standby input vectors. The above method 900 may be applied to each input vector pattern involved and determine the best multi-$V_t$ configuration for each input vector pattern. A weighing function $w_j$ may be used to help determine which devices should be made low-$V_t$ overall and to translate this problem to the well-known minimum-cost satisfiability problem.

Figure 10:
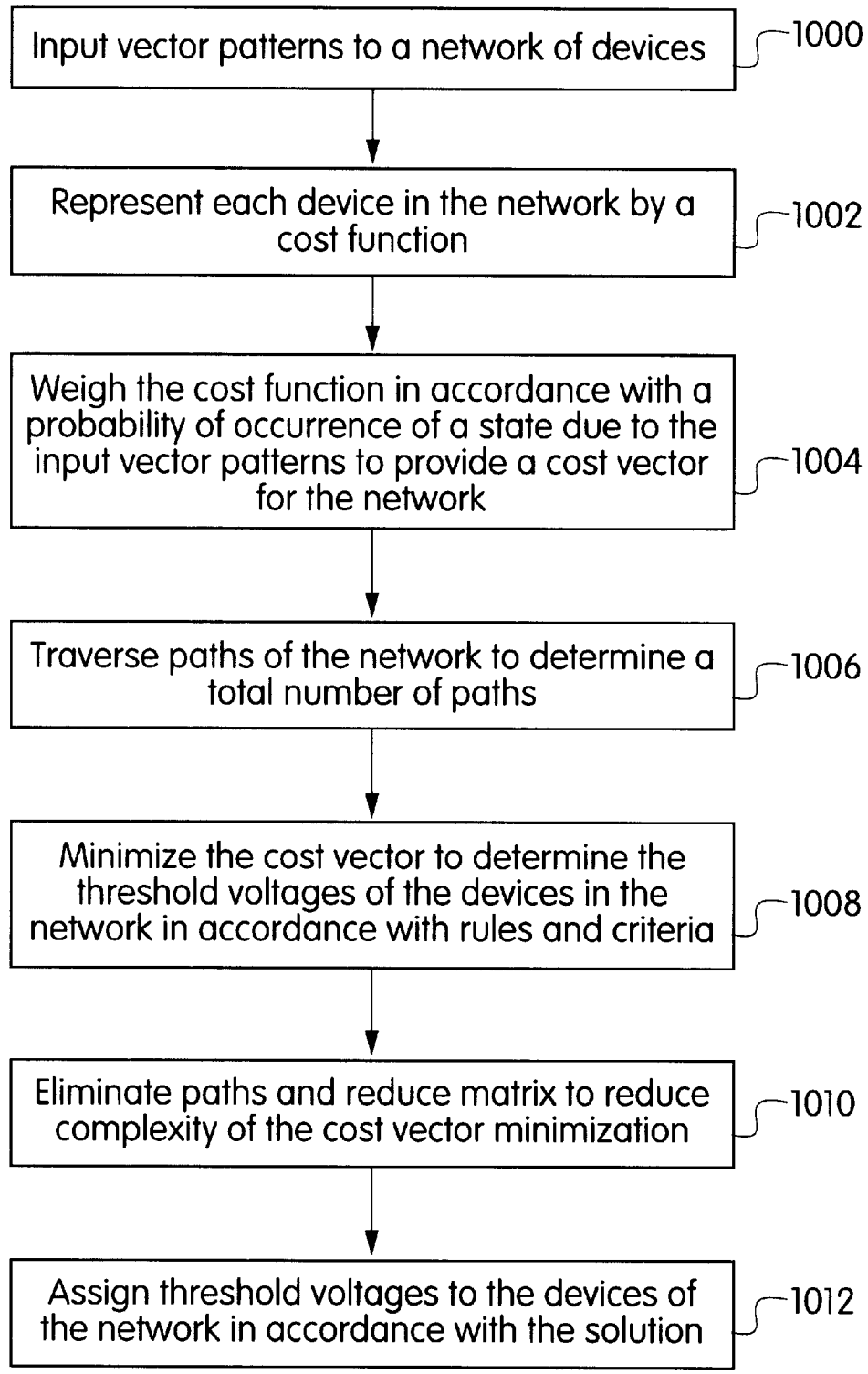
FIG. 10 is a block diagram showing a method for producing a multi-threshold voltage circuit in accordance with the present invention.

Referring to FIG. 10, K input vector patterns are inputted, in block 1000. For each input vector pattern (j), a multi-$V_t$ DCVS network of N devices is determined, and it is represented as $(c_{1j}, c_{2j}, c_{3j}, \ldots c_{Nj})$ where $c_{ij}$ is the cost function for device "i" in the case of input vector pattern j, in block 1002. $c_{ij}=c_0$ for a low $V_t$ device and $c_{ij}=c_1$ for a regular $V_t$ device. Preferably, $c_0=0$ and $c_1=1$, other values are possible, however. In block 1004, the weighing function is then defined as $w_j$ which, in the statistical sense, is the probability of the standby state having input vector pattern j. One property we have is $\Sigma^K_{j=1} w_j=1$. With this weighing function, the final weighted costs of the N devices in the network may be expressed using a vector C where $C=(c_1, c_2, c_3, \ldots, c_N)$ and $c_i=\Sigma^K_{j=1} w_j c_{ij}$. $c_i$ is the final weighted cost for device i. In general, $0 \leq c_i \leq 1$. When $c_i=1$, it is preferred that this device i be made regular-$V_t$. When $c_{i'}=0$, it is preferred that we make this device i' low-$V_t$. For the general case where $0 \leq c_i \leq 1$, the problem of selection of $V_t$ is reformulated into the minimum-cost satisfiability problem to seek the appropriate $V_t$-type device.

The DCVS tree network can be viewed as a graph G(V, E), where $V=(v_1, v_2, v_3, \ldots, v_N)$ is a set of the vertices of the graph and E (where $E_{ij}=(v_i, v_j)$) is the set of edges of the graph. In the graph, each vertex represents a transistor in the network. The set of the edges represent how the devices in the network are connected. The cost of each vertex is the final weighted cost of the corresponding device as calculated from the statistical pattern of the input vectors. The costs are denoted as a vector C where $C=(c_1, c_2, c_3, \ldots, c_N)$.

There are different ways of determining the final cost vectors, depending on a designer's requirements, the designer's emphasis either on low power or on speed, etc. One example has been described for determining the final cost vector. This cost vector serves as a link between the device level knowledge of the DCVS circuit and the linear programming method below. Device level knowledge, the analog aspect of the problem, and non-linear behavior of the device can be accounted for in the final cost vector. For example, if leakage current is of main concern for the designers, the individual cost vectors may be weighed to obtain a final cost vector $C_i$ where $C_i=OR(c_{i1}, c_{i2}, \ldots c_{iN})$. A logical OR function may be used to ensure the $C_i$ will be 1 if any of the $C_{ij}$ terms are 1.

In block 1006, all the possible paths are traversed from the ground to the outputs, and denote this set of paths as $<P>=(P_1, P_2, P_3, \ldots, P_M)$ where M is the total number of paths, and for the jth path, $P_j=(P_{1j}, P_{2j}, P_{3j}, \ldots, P_{Mj})^T$ is a column vector of rank N (where N is the total device number in the network). If a device i exists in this path $P_j$, then $p_{ij}=1$; otherwise $p_{ij}=0$. The end result is that <P> is a matrix of rank N×M, whose elements are either 1 or 0. The ground can be treated as the root of the device tree structure and the outputs represents the leaves of the device tree structure.

In block 1008, now, the problem can be formulated. The goal is to minimize the total cost of the network under the following constraint, that is, there is at least one device having a regular $V_t$ in each path defined above to cut off the leakage current. The corresponding satisfiability problem is formulated as follows:

Find a solution vector X, where $X=(x_1, x_2, x_3, \ldots, x_N)^T$ and $x \in B$ so that $C^T X$ is minimized, under the constraint $<P>^T X \geq 1$.

To solve this satisfiability problem, essential regular transistors are identified (transistors required to be regular $V_t$)

and their corresponding rows and columns are removed from the matrix, in block 1010. Paths that are dominated by other paths are then identified. These dominated paths are also removed. The above two operations aide in reducing the size of the matrix. For the remaining matrix, the weighted covering problem is solved to obtain the minimum weighted solution for the devices that should be made with regular $V_t$. Heuristic algorithms for this type of problem are known to one skilled in the art. The most commonly-used algorithm is a "branch-and-bound" algorithm.

Once the solution X is found, the devices are assigned to be either low $V_t$, or regular $V_t$, depending on the values of X, in block 1012. The device i is made low $V_t$, if $x_i$ in the solution X is 0; and the device i' is made regular $V_t$ if $x_{i'}$ in solution X is 1. The final mixed-$V_t$ DCVS tree network is then resolved.

Simulation Results

The correct logic behavior of the multi-$V_t$ DCVS tree structure has been confirmed by simulation results. The device model parameters used are based on multi-$V_t$ CMOS7S technology. Other technologies are contemplated for use with this invention as well. The delay, leakage current and switching power simulation results for typical DCVS circuits with and without mixed $V_t$ devices are summarized in Table 1. The base DCVS tree structure is a SUM as shown in FIG. 7A. The multi-$V_t$ DCVS tree is constructed according to the method described above and for input condition ABC=000 while the low-$V_t$ DCVS tree is made of all low $V_t$ devices and the regular-$V_t$ DCVS tree made of all regular $V_t$ devices. The structures used for comparison all have identical sizes. The transition that is considered in the delay and switching power simulation is from ABC=000 to ABC=001. The standby-state is assumed ABC=000. The output loading is 10 pF and the clock pulse is 4 nsec in period and 10 psec in slew.

TABLE 1

| Performance Comparison between DCVS Circuits | | | | | | | | |
|---|---|---|---|---|---|---|---|---|
| DELAY (psec) | | | Leakage Current (nA) | | | Switching Power (pJ/switch) | | |
| static | Domino | NORA | static | Domino | NORA | static | Domino | NORA |
| regular $V_t$ | | | | | | | | |
| 107 | 75 | 67 | 35 | 6.7 | 6.7 | 0.64 | 0.353 | 0.37 |
| multi-$V_t$ | | | | | | | | |
| 85 | 68 | 62 | 36 | 7.2 | 7.2 | 0.64 | 0.366 | 0.38 |
| low $V_t$ | | | | | | | | |
| 81 | 66 | 61 | 214 | 40 | 40 | 0.63 | 0.372 | 0.39 |

As shown in Table 1, the low-$V_t$ DCVS circuits are the fastest among the three types compared. However, its standby leakage current is also the highest, about 6 times as much as that for regular $V_t$ and multi-$V_t$. The multi-$V_t$ DCVS is almost as fast as the low-$V_t$ DCVS, yet its leakage current is approximately as low as for the regular $V_t$ DCVS. For applications which require low standby power, multi-$V_t$ DCVS is clearly the best choice. Also as shown in Table 1, the NORA and Domino versions of the DCVS circuits are much faster than the static version. The multi-$V_t$ DCVS DOMINO and NORA circuits show improved characteristics such as higher speed, lower leakage current and smaller layout area.

Mixed or Multi-$V_t$ DCVS tree optimization can be extended to cases of multi-functional DCVS logic or cases where multiple outputs are produced. It is also contemplated that the methods disclosed herein can be applied to various logic circuits and semiconductor devices to obtain greater speed without a large increase in leakage current.

Having described preferred embodiments of a multi-threshold-voltage circuit and method (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims:

What is claimed is:

1. A method for producing a multi-threshold voltage circuit comprising the steps of:
   providing a network of devices;
   inputting input vector patterns to determine states of internal nodes of the network;
   for each input vector pattern, each device is represented by a cost function;
   weighing the cost functions of each of the devices based on probability of occurrence of the input vector patterns to provide a cost vector for the network;
   traversing paths in the network from a ground to an output of the network to determine a total number of paths; and
   minimizing the cost of the cost vector for the network by determining which devices have a first threshold voltage and which devices have a second threshold voltage such that each path includes a first threshold voltage device between the output and the ground of the path.

2. The method as recited in claim 1, wherein the step of providing a network of devices includes providing a tree logic structure for a differential cascode voltage switch (DCVS) circuit.

3. The method as recited in claim 1, wherein the step of weighing the cost functions of each of the devices based on probability of occurrence of the input patterns to provide a cost vector for the network includes weighing the cost functions by multiplying the cost functions by a weighing factor, $w_j$, wherein $w_j$ provides a probability of a state having an input pattern j.

4. The method as recited in claim 1, wherein the step of minimizing the cost of the cost vector for the network includes the steps of:
   representing the cost vector as C;
   providing a solution vector $X=(x_1, x_2, \ldots x_n)^T$ wherein each component of X represents a first threshold voltage device or a second threshold voltage device; and
   solving for X by minimizing $C^T X$.

5. The method as recited in claim 4, further comprising the step of constraining the solution vector X by $<P>^T X \geq 1$.

6. The method as recited in claim 1, wherein the first threshold voltage is greater than the second threshold voltage.

7. The method as recited in claim 1, further comprising the step of reverse biasing the second threshold voltage devices in off states for reducing leakage current.

8. The method as recited in claim 1, wherein the step of traversing paths in the network from a ground to an output of the network to determine a total number of paths includes the step of eliminating paths dominated by other paths.

9. The method as recited in claim 1, further comprising the step of adjusting devices in the network between the first threshold voltage and the second threshold voltage based on criteria of speed, layout area and leakage current.

10. The method as recited in claim 1, further comprising the step of assigning devices in the network as first threshold voltage devices and second threshold voltage devices based on the minimized cost vector.

11. A method for producing a multi-threshold voltage differential cascode voltage switch (DCVS) circuit comprising the steps of:

providing a network of devices in a DCVS tree logic circuit;

inputting input vector patterns to determine states of internal nodes of the network;

for each input vector pattern, each device is represented by a cost function;

weighing the cost functions of each of the devices based on probability of occurrence of the input vector patterns to provide a cost vector for the network;

traversing paths in the network from a ground to an output of the network to determine a total number of paths;

minimizing the cost of the cost vector for the network by determining which devices have a first threshold voltage and which devices have a second threshold voltage such that each path includes a first threshold voltage device between the output and the ground of the path; and adjusting which devices have the first threshold voltage and which devices have the second threshold voltage based on performance criteria.

12. The method as recited in claim 11, wherein the step of weighing the cost functions of each of the devices based on probability of occurrence of the input patterns to provide a cost vector for the network includes weighing the cost functions by multiplying the cost functions by a weighing factor, $w_j$, wherein $w_j$ provides a probability of for a state having an input pattern j.

13. The method as recited in claim 11, wherein the step of minimizing the cost of the cost vector for the network includes the steps of:

representing the cost vector as C;

providing a solution vector $X=(x_1, x_2, \ldots x_n)^T$ wherein each component of X represents a first threshold voltage device or a second threshold voltage device; and solving for X by minimizing $C^T X$.

14. The method as recited in claim 13, further comprising the step of constraining the solution vector X by $<P>^T X \geq 1$.

15. The method as recited in claim 11, wherein the first threshold voltage is greater than the second threshold voltage.

16. The method as recited in claim 11, further comprising the step of reverse biasing the second threshold voltage devices in off states for reducing leakage current.

17. The method as recited in claim 11, wherein the step of traversing paths in the network from a ground to an output of the network to determine a total number of paths includes the step of eliminating paths dominated by other paths.

18. The method as recited in claim 11, wherein the performance criteria includes at least one of speed, layout area and leakage current.

19. The method as recited in claim 11, further comprising the step of assigning devices in the network as first threshold voltage devices and second threshold voltage devices based on the minimized cost vector.

* * * * *